(12) United States Patent
Grundlingh

(10) Patent No.: US 7,317,352 B2
(45) Date of Patent: Jan. 8, 2008

(54) POWER AMPLIFIER

(75) Inventor: Johan M. Grundlingh, Kinburn (CA)

(73) Assignee: Zarbana Digital Fund LLC, Wilmington, DE (US)

( * ) Notice: Subject to any disclaimer, the term of this patent is extended or adjusted under 35 U.S.C. 154(b) by 2 days.

(21) Appl. No.: 11/268,765

(22) Filed: Nov. 7, 2005

(65) Prior Publication Data
US 2006/0238244 A1  Oct. 26, 2006

Related U.S. Application Data

(60) Provisional application No. 60/625,301, filed on Nov. 5, 2004.

(51) Int. Cl.
*H03G 3/20* (2006.01)
(52) U.S. Cl. ........................... 330/136; 330/129
(58) Field of Classification Search ............... 330/297, 330/10, 136, 129, 207 P, 298
See application file for complete search history.

(56) References Cited

U.S. PATENT DOCUMENTS

| | | | |
|---|---|---|---|
| 6,583,664 B2 * | 6/2003 | Mathe et al. | 330/10 |
| 6,653,898 B2 * | 11/2003 | Monroe | 330/51 |
| 7,091,772 B2 * | 8/2006 | Friedel et al. | 330/10 |
| 7,102,427 B2 * | 9/2006 | Matsumoto et al. | 330/10 |
| 2003/0231062 A1 * | 12/2003 | Bar-David et al. | 330/297 |

* cited by examiner

*Primary Examiner*—Henry Choe
(74) *Attorney, Agent, or Firm*—Stolowitz Ford Cowger LLP

(57) ABSTRACT

Improved methods and systems for amplifying a signal are provided. Specifically, systems and methods for amplifying a signal through a lossy switch element tied to two or more voltage sources are provided. In the preferred embodiment, envelope information from the signal is used to smoothly transition between the two or more voltage sources to provide signal amplification over an increased range.

36 Claims, 4 Drawing Sheets

POWER AMPLIFIER

CROSS-REFERENCE TO RELATED APPLICATION

This application claims the benefit of U.S. Provisional Patent Application No. 60/625,301 filed Nov. 5, 2004 the entire disclosure of which is incorporated herein by reference.

FIELD OF THE INVENTION

The invention relates generally to the field of power amplifiers. Specifically, the invention relates to power supply configurations and related methods suitable for powering an amplifier while substantially reducing switching discontinuities. In particular, embodiments of the invention are suitable for powering an RF power amplifier in a high efficiency and high linearity mode.

BACKGROUND OF THE INVENTION

Various amplifiers and power supplies are implemented using Envelope Elimination and Restoration (EE&R) techniques. The Kahn amplifier represents one such implementation of the EE&R techniques. An exemplary EE&R system is shown in FIG. 1. As shown, the desired signal 100 is synthesized from a constant amplitude variable phase RF signal 102, and a baseband signal representing the envelope amplitude 104. Additionally, the baseband envelope is applied to the Vdd supply 106 of an RF amplifier 108. Generally, the Kahn amplifier operates in saturation, and the saturated power is varied by changing Vdd. There is also a class of amplifiers referred to as "Adaptive Bias" amplifiers. Like the EE&R systems, there are variable power supplies on one or more of the amplifier supply connections; unlike EE&R, an "Adaptive Bias" amplifier receives an RF signal with its envelope.

Typically, EE&R amplifiers use an expensive and complex switching variable power supply. The requisite variable supply must be efficient, and very fast. To be efficient, it needs to employ switching. Switching speed needs to be much higher than the baseband bandwidth, making it expensive. The switching spurs appear as out of band spurs in various EE&R systems. Also, the variable power supply needs to have rise/fall times and delays much faster than envelope transition times. These factors contribute to the overall expense and complexity of variable switching power supplies.

In the past, multiple power supplies have been proposed in lieu of the variable power supply used in EE&R systems, but in such embodiments discrete and abrupt switching occurs between supplies. These approaches can cause switching discontinuities and steps.

A need therefore exists for improved amplifier and power supply configurations that improve operating efficiencies while lowering fabrication costs and complexity.

SUMMARY OF THE INVENTION

In accordance with one aspect of the invention, a circuit for controlling power delivery to an amplifier is provided. The circuit includes a first voltage source for transmitting a first fixed voltage to the amplifier; a second voltage source for transmitting a second fixed voltage to the amplifier, the second fixed voltage being a lower value than the first voltage; and a control element having one control input signal for transitioning between the two voltage sources and connecting at least one of the voltage sources to the amplifier. The control element causes the amplifier to receive a transitional voltage from one respective voltage source substantially equal to the fixed voltage previously transmitted from the other respective voltage source, such that a transitional overlap in fixed voltage values results in a reduction in transitional discontinuities. The control elements are controlled so that there is adequate head room for the envelope of the signal.

The circuit's control element applies either the second voltage (with a minimal voltage loss) to the amplifier, or the first voltage (with a variable voltage drop, dependent on a control signal) to the amplifier, depending on the control signal voltage. The reduction in transitional discontinuities implies that the transfer function from the control input signal to the voltage applied to the amplifier is continuous and well behaved. Additionally, the circuit's control element includes a first variable series pass element and a second variable series pass element, each in communication with the amplifier through a shared connection and with one respective voltage source. At least one of the first and the second variable series pass elements in the circuit includes a variable resistance component. In one exemplary circuit, at least one of the variable resistance components is a transistor. However, at least one of the variable resistance components is a diode in another exemplary circuit.

The circuits first and second variable series pass elements can be connected in a source a follower configuration. The circuit can further include an envelope detector. The envelope detector can be a digital signal processor. The circuit's amplifier can be a Class F amplifier. The control element includes a controllable resistance element in some circuit embodiments. It can also be a lossy control element which includes at least two transistors. In some circuits, each transistor is in electrical communication with at least one voltage source. In a specific circuit embodiment, one transistor is in communication with the first voltage source and the other transistor is in electrical communication with the second voltage source. Additionally, the envelope detector can control the control element such that an envelope signal is reproduced at the shared connection, which substantially gains and offsets set for improved efficiency and linearity.

The voltage supplied to the amplifier through the control element can have the beneficial effect of making the amplifier more linear. For example, if the amplifier demonstrates gain expansion when operating from a fixed power supply (class B, C, E, and F amplifiers typically do), the control of the power supply tends to reduce the amount of the gain expansion, rendering a more linear amplifier.

In accordance with another aspect of the invention, a method for amplifying a signal is provided. The method includes the steps of receiving an input signal having an associated input signal envelope; detecting the input signal envelope; establishing a voltage threshold in response to the signal envelope; while the input signal envelope is below the threshold, amplifying the input signal by energizing an amplifier with at least one fixed voltage received from a first power supply; and when the signal envelope exceeds the threshold, transitioning to a second fixed voltage from a second power supply, which generates a second fixed voltage, such that the transitioning is substantially smooth and so that the amplifier continues to have adequate head room.

In turn, the step of transitioning to a second fixed power supply dissipates power at a predetermined power level. In some embodiments of the method, the first and second fixed voltages are selected from a range of about 3 volts to about 8 volts. Additionally, the method teaches transitioning between the first and the second fixed voltages occurs at a switching bandwidth of at least about 15 MHz in some instances. In some embodiments, some components of the invention can operate at bandwidths between 2 GHz and 5 GHz, at power levels between 10 dBm and 35 dBm, at temperatures of −20 to +85 C, and/or with gains of 10 dB-20 dB. However, in various embodiments different voltages and bandwidths can be used as appropriate for a given implementation.

In accordance with still another aspect of the invention, a method for powering an amplifier is provided. The method includes the steps of transmitting a first fixed DC power level from a first power supply through a series pass element to an amplifier; transmitting a second fixed DC power level from a second power supply through a series pass element to the amplifier; transitioning between the two power supplies such that the amplifier receives one DC power level from one of the power supplies in response to a signal envelope; and transitioning between the two power supplies such that the amplifier receives one DC voltage level from one of the power supply to accommodate higher envelopes, levels through a substantially smooth transition such that power discontinuities between the two power levels are substantially reduced, the transitioning regulated by a two component control element.

The amplifier can be a Class F or a Class E amplifier. In one embodiment of the method, transitioning between the two power supplies results in substantially continuous transitions between the two fixed power levels. The step of transitioning between the two power supplies can dissipate more power than a unitary variable switching power supply. Moreover, the control element can include at least one of a transistor or a diode. The step of controlling the series pass transistors adjusts the voltage received by the amplifier as the amplitude (envelope) of the RF signal varies to optimize the efficiency and linearity of the amplifier.

BRIEF DESCRIPTION OF THE DRAWINGS

These embodiments and other aspects of this invention will be readily apparent from the detailed description below and the appended drawings, which are meant to illustrate and not to limit the invention, and in which.

DETAILED DESCRIPTION OF THE INVENTION

Figure 1:
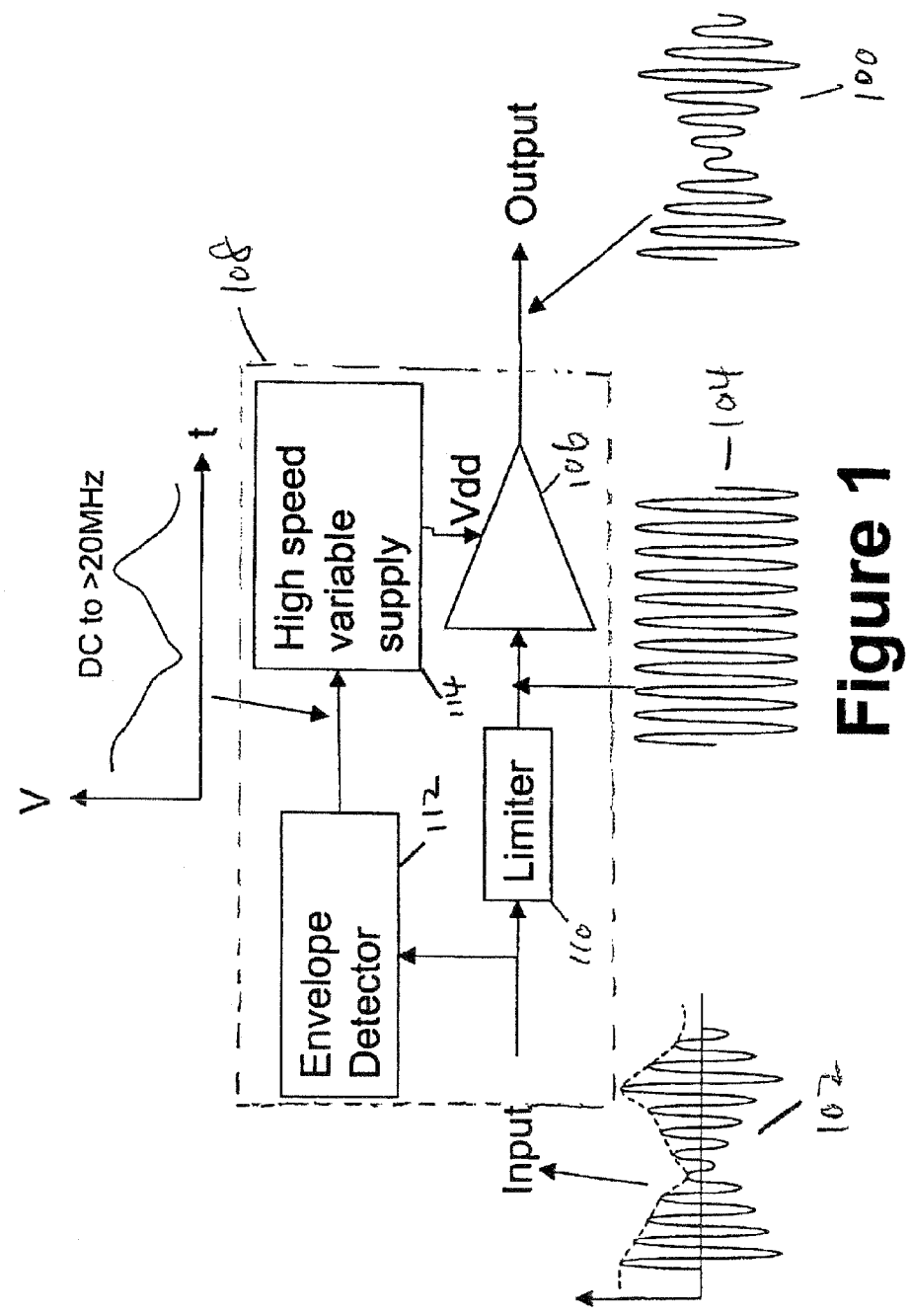
FIG. 1 is a block diagram illustrating existing art.

In various embodiments of the invention, improved methods and systems for amplifying a signal are provided. Specifically, systems and methods for amplifying a signal through a lossy switch element tied to two or more voltage sources are provided. In the preferred embodiment, envelope information from the signal is used to smoothly transition between the two or more voltage sources to provide signal amplification over an increased range.

For signals having a large peak-to-average power ratio, linear power amplifiers become very low in power-added efficiency. This is because the amplifier must be backed off (at its input) most of the time from the signal level providing its highest efficiency. This is necessary in order to be able to amplify the signal during its peak power without clipping.

Another technique for signals having a large peak-to-average power ratio is the Kahn architecture (also called "Envelope Elimination and Restoration" or EE&R). Here, the input signal always drives the amplifier towards saturation so that the amplifier always operates near its maximum efficiency. This is achieved by only applying the time varying phase-modulated component of the signal to the amplifier input. The time varying amplitude-modulated component of the signal is imposed onto the output of the amplifier by varying the gain of the amplifier. This is achieved by rapidly adjusting the bias being applied to the amplifying device.

The time varying bias is typically achieved with a low loss, rapidly varying supply voltage. This can, in principal, be realized with a switch-mode supply. This variable supply must ensure that there is no latency between the amplitude-modulated component of the signal and the phase modulated portion of the signal. In addition, the variable supply must not cause any distortion due to non-linear tracking of the envelope portion of the signal. All these are difficult to achieve with low loss, over a large dynamic range, and at a rapid rate.

Some embodiments of the invention take advantage of both the linear power amplifier (PA) and the Kahn PA, while avoiding their respective difficulties. In one aspect the invention relates to a system for efficient linear amplification of radio frequency signals. During the low amplitude duration of the signal, a given amplifier embodiment converts to a linear amplifier (with a fixed bias voltage). At low RF powers, the inefficiency associated with a linear PA is tolerable. Since the amplifier operates using a lower power supply voltage, it is more fully utilized and operates at a higher efficiency at this time.

During the high amplitude periods of the signal, an amplifier in one embodiment converts to Kahn like operation with the bias voltage increasing to insert the peak signal amplitude variation. This can be done without the use of a high efficiency switch mode supply since the peak amplitudes occur infrequently. Hence the variable bias can be achieved with a lower efficiency variable supply circuit without reducing the overall (time averaged) efficiency significantly. In addition, the dynamic range required during the high amplitude duration is less than what is required if the Kahn operation also provides the amplitude changes for low amplitude variations. Reduced dynamic range reduces the performance requirement in the envelope path, specifically the bandwidth required.

In one embodiment, the invention incorporates an adaptive bias implementation with some of the desirable characteristics of a Kahn amplifier. The invention uses a simple fast source follower (supplied by two efficient power sources) to control the drain bias. The source follower will impart a dissipative loss. Part of the invention relates to the realization that, although the source follower necessarily dissipates some power (lossy), it is still better (in terms of efficiency and linearity) than a linear amplifier and simpler than a Kahn amplifier.

A lossy switch element (LSE) or lossy control element (LCE) causes the dissipation of energy. Further, in a lossy switch (or control) element a portion of the power delivered to the LSE/LCE appears as heat that is not recovered as work by the system incorporating the LSE/LCE.

Figure 2A:
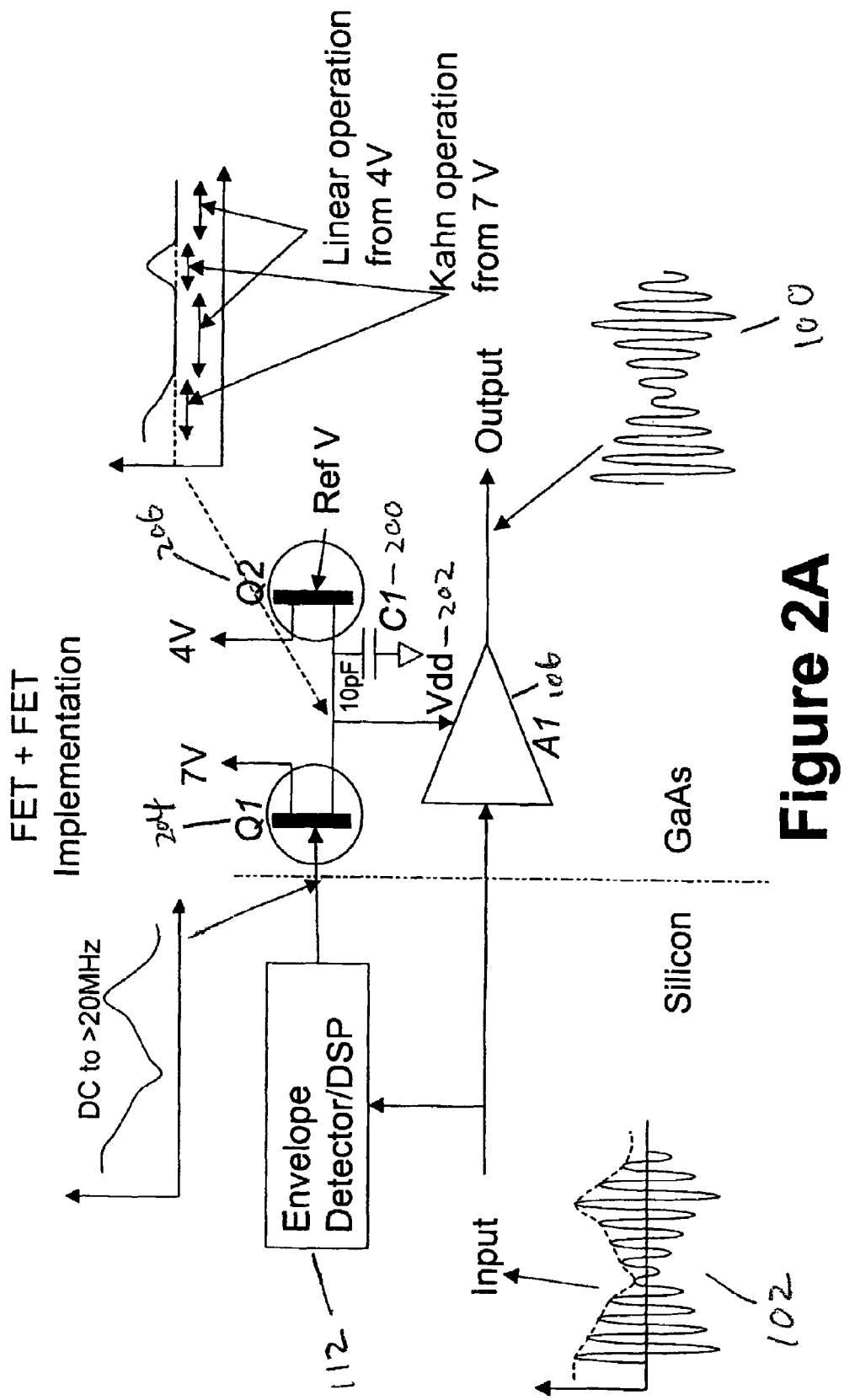
FIG. 2A is a block diagram illustrating one embodiment of the invention.
Figure 2B:
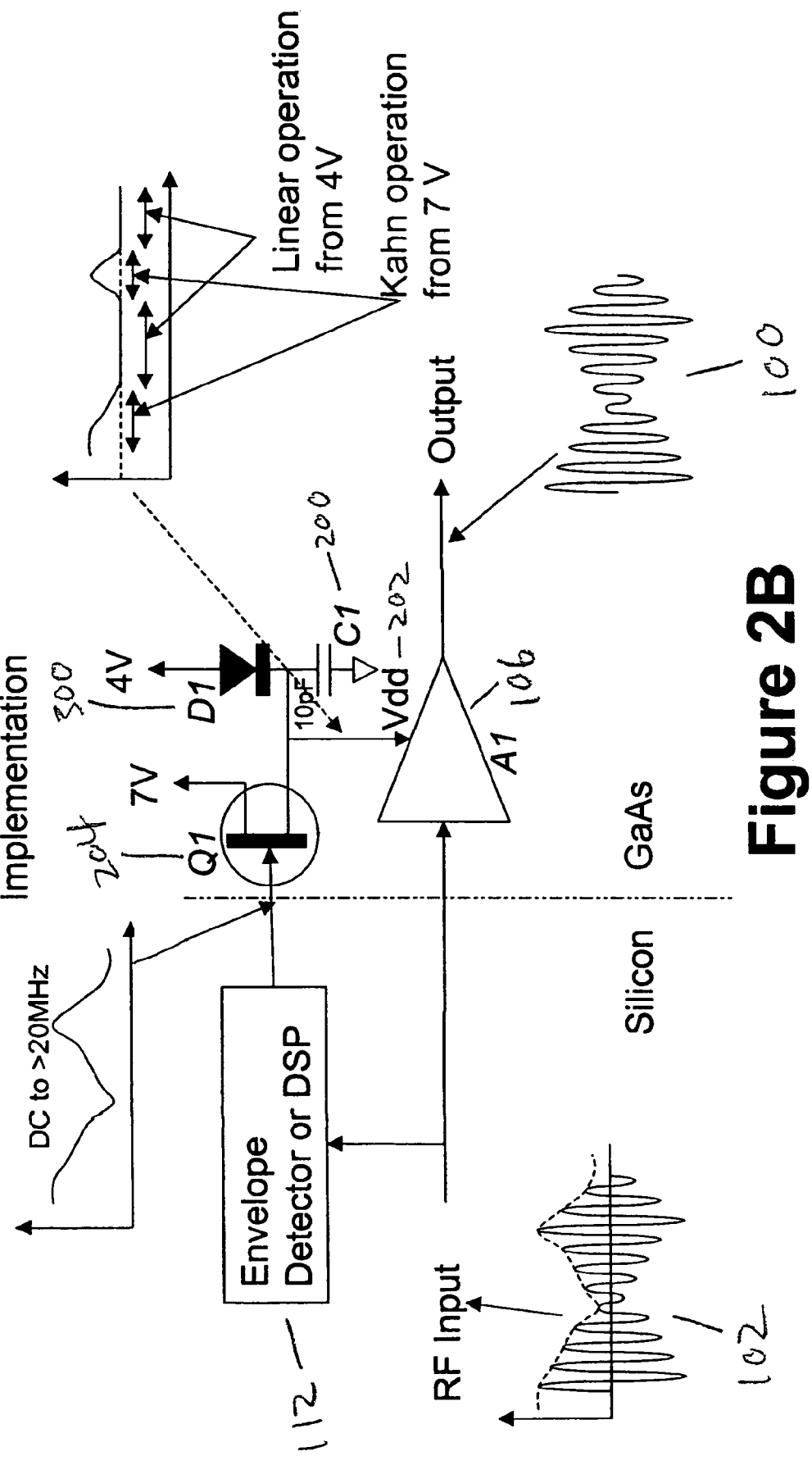
FIG. 2B is a block diagram illustrating another embodiment of the invention.

In one embodiment, the invention uses two fixed supplies rather than one variable supply. Additionally, envelope information is retained almost at all times. Two exemplary source follower dual power supply embodiments of the invention are shown in FIGS. 2A and 2B. In FIG. 2A, a FET/FET source follower configuration is shown. While in FIG. 2B, a FET/Diode source follower configuration is shown. In different embodiments, different families and types of amplifiers, transistors, capacitors and diodes are used without limitation as desirable for a given PA implementation.

According to the embodiment shown in FIG. 2A, a capacitor 200 (C1) provides an RF short for an RF amplifier 106 (A1). The RF amplifier 106 has an RF input 102, an RF output 100, and a Voltage dependent input 202. A first switch 206 supplies power to the amplifier 106 from a lower (4v) power supply most of the time. A second switch 204 starts to feed power to the amplifier 106 when the envelope of the input signal 102, as measured by the envelope detector 112 crosses a threshold. Instead of "switching" between the 7V and 4V power supplies, the switches 204, 206 are lossy elements, which are both active simultaneously.

In the preferred embodiment, the amplifier 106 is functioning within desired parameters when the following conditions occur: 1) Vdd 202 on the amplifier 106 is close to the upper supply at the envelope peaks; 2) the amplifier is operating compressed, and has no head room at the envelope peaks; 3) the lower supply is used for the maximum amount of time, which implies that the upper supply starts to be used only when operation of the amplifier on the lower supply causes inadequate headroom or clipping; and 4) Vdd 202 is smooth, systematic, and does not exhibit fast transitions, which implies that C1 200 must be as small as possible, consistent with its job as an RF short. The final result is that the voltage into the amplifier depends on whether the envelope 216 is increasing or decreasing at given amplitude. This makes pre-distortion difficult.

FIG. 2B illustrates an embodiment of a slight different implementation of the amplifier from the one in FIG. 2A. This is a FET/Diode implementation. The diode 300 (D1) replaces the switch 206 in the power supply in this embodiment. All other components remain the same as in the FET/FET implementation illustrated in FIG. 2A.

Figure 3:
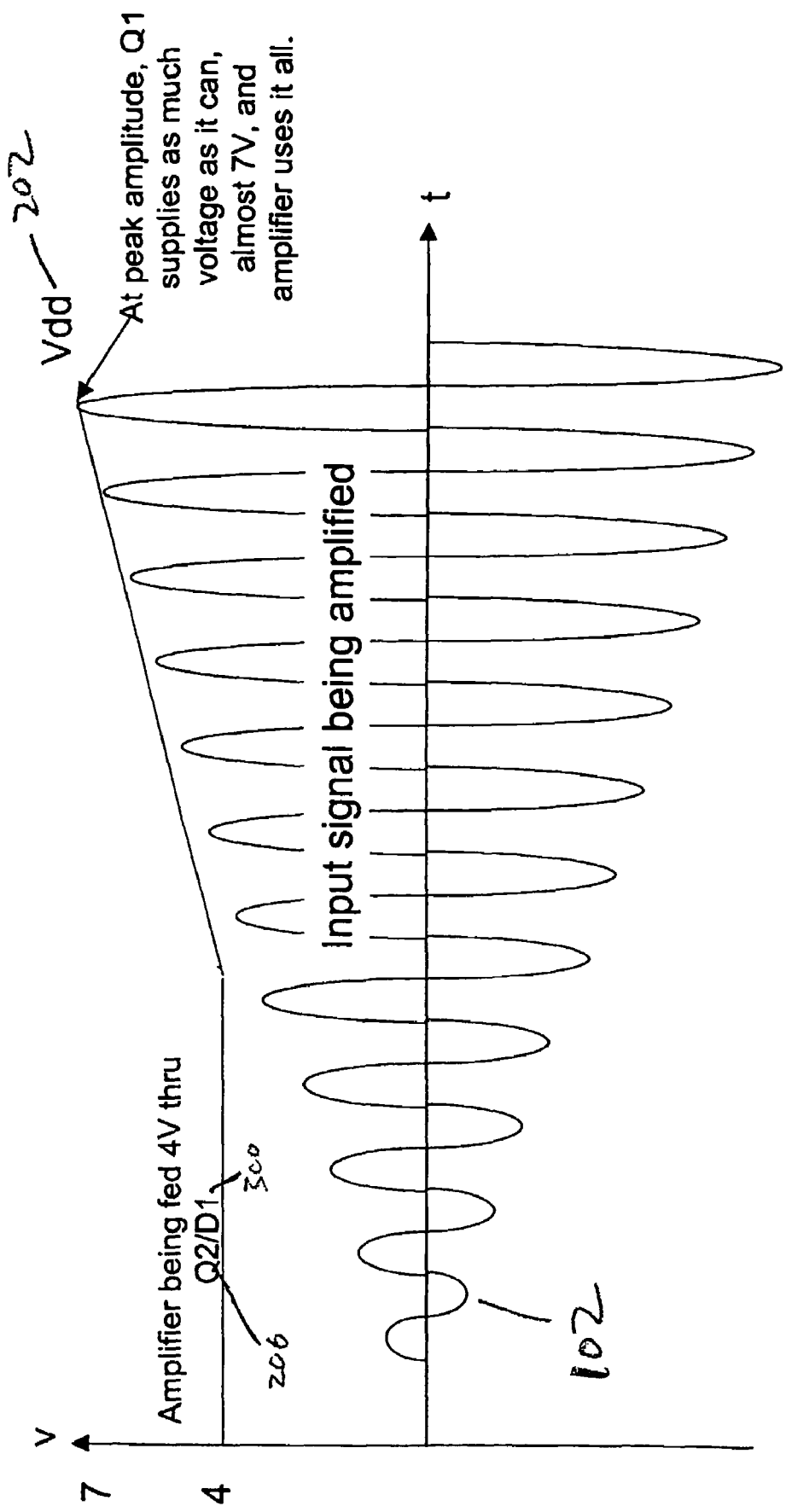
FIG. 3 is a diagram illustrating the amplification of a waveform in various embodiments of the invention.

FIG. 3 depicts the features and regions of interest designated in FIGS. 2A and 2B with respect to the envelope 216 and related signals 204. It is assumed that an RF signal with a ramp shape 400 is being amplified in FIG. 3. At low envelope, the amplifier operates only on the 4V supply through D1 310 or Q2 210. As the envelope increases, the amplifier would clip at some point if it stayed on the 4V rail. As such, transistor Q1 214 starts to turn on, increasing Vdd 218. As the envelope increases, at some point the amplifier would clip if it stayed on the 4V rail. As such, transistor Q1 starts to turn on, increasing Vdd. It does not turn on suddenly, though. It turns on so that if the amplifier needs, for example, 4.5V to avoid clipping, 4.5V is supplied by dropping the 7V supply down to 4.5V. Ideally, as soon as power is being taken from the 7V supply, the 4V supply would be shut off. This is done with D1 310 or Q2 210. In fact, there will be a narrow range of amplitudes in which both supplies are supplying current, and design parameters would limit this range. The input signal can have an amplitude such that the amplifier is clipping (that is, operating at approximately P1 dB) when operating off of the 7V supply. The signal on the gate of Q1 214 would ideally be adjusted so that, around the peaks Q1 214 supplies 7V (or as close to 7V as possible) to the amplifier.

In various embodiments, the amplifier, A1 202, is best implemented by an amplifier that is efficient and exhibits expansion (that is, gain increases as input power increases up until it runs out of headroom). We use class F, but class E, C, B can be used as well. The desired shape (amplitude and DC offset) of the signal applied to the gate of Q1 214 depends on the AM-AM characteristics of the Amplifier A1 302 at different supplies. We use amplifiers that have gain that increases at higher Vdd, and gain expansion. This is a desirable combination because various embodiments of the invention tend to make such amplifiers more linear.

The invention is typically used to amplify complex, narrow band RF waveforms (the "input waveform") such as those used in 802.11 WLAN systems. The exciter feeding the amplifier would deliver two signals: an RF signal similar to the input waveform, and a baseband signal that follows the amplitude of the input waveform. The RF signal is fed into a high efficiency amplifier such as a class F amplifier.

The baseband signal is used to control the DC drain or collector voltage on the amplifier in the following manner: if the amplitude of the input waveform is smaller than a threshold, the amplifier DC terminal receives its voltage from a low voltage supply. If the amplitude waveform is larger than this threshold, the amplifier DC terminal receives its voltage from a higher voltage supply. To prevent discontinuities, this is done smoothly so that the amplifier sees either the lower supply, or a voltage between the low and the high voltage supply that follows the waveform. A source follower and a diode, or a pair of source followers can perform this function. Although power is lost, this approach is relatively inexpensive and easy to implement in a semiconductor implementation in some embodiments.

Contrast the present invention to the Kahn amplifier, in Kahn, the envelope is eliminated from the RF signal going into the amplifier, and the power supply is continuously variable and employs a high efficiency (but difficult to build) switching supply technique. Another feature of the invention is to use of pre-distortion in a silicon chip next to the PA that allows independent control of both the RF and baseband path. Another unique feature is the use of a class F amplifier, traditionally used only for non-linear applications.

In various embodiments of the invention, the control input is controlled in a manner to maximize the amount of time the amplifier uses the lower voltage power source (and by implication minimizes the amount of time the amplifier uses the higher power supply), and uses the higher power supply only when the highest power parts of the envelope are being amplified. The signal applied to the control input (that is, the variable resistor, or transistor) in series with the higher power supply is substantially the envelope signal (a voltage proportional to the input envelope) with an amplitude and DC offset to maximize efficiency and minimize non-linearity. The amplitude and offset of the control signal and the amplitude of the RF input signal to the amplifier is adjusted so that 1) the controlled amplifier receives maximum voltage at the peaks in the RF signal, and the amplifier is operating approximately at P1 dB at these peaks (or, more generally, in saturation); and 2) the control circuit switches from the low power supply to the high power supply (or vice-versa) when the amplifier is approximately at P1 dB when operating with the low supply. The signal applied to the control element (that is, the variable resistor, or transistor) in series with the higher power supply is generated by a DSP engine to maximize efficiency and minimize non-linearity.

The voltage delivered to the amplifier in the current embodiment is either the low voltage power supply, or a voltage between the low voltage supply and the high voltage supply (all controlled by the envelope). This means that at very low envelopes, the amplifier still receives the full voltage from the low voltage supply. One could also arrange it so that at low envelopes the series pass element drops the low voltage supply, and the amplifier always has a voltage scaled to the amplitude of the signal.

Having shown the preferred embodiments, one skilled in the art will realize that many variations are possible within the scope and spirit of the claimed invention. It is therefore the intention to limit the invention only by the scope of the claims.

What is claimed is:

1. A circuit for controlling power delivery to an amplifier, the circuit comprising:
    a first voltage source for transmitting a first fixed voltage to the amplifier;
    a second voltage source for transmitting a second fixed voltage to the amplifier, the second fixed voltage being a lower value than the first voltage; and
    a control element having one control input signal for transitioning between the two voltage sources and connecting at least one of the voltage sources to the amplifier,
    the control element causing the amplifier to receive a transitional voltage from one respective voltage source substantially equal to the fixed voltage previously transmitted from the other respective voltage source, such that a transitional overlap in fixed voltage values results in a reduction in transitional discontinuities.

2. The circuit of claim 1, wherein the control element applies either the second voltage to the amplifier or the first voltage to the amplifier, depending on a control signal voltage and wherein the second voltage has a minimal voltage loss when applied to the amplifier and the first voltage has a variable voltage drop when applied to the amplifier.

3. The circuit of claim 1, wherein the transfer function from the control input signal to the voltage connected to the amplifier is continuous and well behaved.

4. The circuit of claim 1, wherein the control element comprises:
    a first variable series pass element connected to the first voltage source; and
    a second variable series pass element connected to the second voltage source, wherein each of the variable series pass elements is in communication with the amplifier through a shared connection.

5. The circuit of claim 4 wherein at least one of the first and the second variable series pass elements comprises a variable resistance component.

6. The circuit of claim 5 wherein at least one of the variable resistance components is a transistor.

7. The circuit of claim 4, wherein at least one of the first and second variable series pass elements is a diode.

8. The circuit of claim 4 wherein the first and second variable series pass elements are connected in a source follower configuration.

9. The circuit of claim 1 wherein the circuit further comprises an envelope detector.

10. The circuit of claim 9 wherein the envelope detector is a digital signal processor.

11. The circuit of claim 1 wherein the amplifier is a Class F amplifier.

12. The circuit of claim 1 wherein the control element comprises a controllable resistance element.

13. The circuit of claim 1 wherein the control element is a lossy control element and comprises at least two transistors.

14. The circuit of claim 13, wherein each of the transistors is connected to at least one of the first and second voltage sources.

15. The circuit of claim 14, wherein one of the transistors is connected to the first voltage source and another one of the transistors is connected to the second voltage source.

16. The circuit of claim 9 wherein the envelope detector controls the control element such that an amplified envelope signal is reproduced at the shared connection.

17. A method for amplifying a signal, comprising:
    detecting an envelope associated with an input signal;
    establishing a voltage threshold in response to the envelope; and
    amplifying the input signal by energizing an amplifier with a controllable voltage;
    wherein the controllable voltage includes a fixed voltage when the envelope is below the voltage threshold and a variable voltage when the envelope is above the voltage threshold; and
    wherein the fixed voltage and the variable voltage are substantially equal when the envelope is at the voltage threshold thereby providing a smooth transition between the fixed voltage and the variable voltage.

18. The method of claim 17, comprising providing the variable voltage with a power supply that dissipates power at a predetermined power level.

19. The method of claim 17, wherein the fixed voltage is selected from a range of about 3 volts to about 8 volts and wherein the variable voltage is provided by a power supply selected from a range of about 3 volts to about 8 volts.

20. The method of claim 17, including transition between the fixed voltage and the variable voltage at a switching bandwidth of at least about 15 MHz.

21. A method for powering an amplifier, comprising:
    providing a fixed DC voltage level from a first power supply through a first series pass element to an amplifier;
    providing a variable DC voltage level from a second power supply through a second series pass element to the amplifier; and
    transitioning between the first and second power supplies in response to a signal envelope
    such that the amplifier receives the fixed DC voltage level from the first power supply at lower amplitudes of the signal envelopes and the variable DC voltage level at higher amplitudes of the signal envelope, wherein the variable DC voltage level is substantially equal to the fixed DC voltage level during the transitioning.

22. The method of claim 21 wherein the amplifier is a Class F or a Class E amplifier.

23. The method of claim 21, wherein transitioning between the first and second power supplies results in a substantially continuous transition between the fixed DC voltage level and the variable DC voltage level.

24. The method of claim 21, wherein transitioning between the first and second power supplies dissipates more power than a unitary variable switching power supply.

25. The method of claim 21, further comprising controlling the first and second series pass elements to adjust the voltage received by the amplifier as the amplitude of an RF signal varies to optimize the efficiency and linearity of the amplifier.

26. The method of claim 17, wherein the variable voltage is provided through a variable resistance element controlled by the input signal envelope such that the controllable voltage is an amplified envelope signal when the input signal envelope is above the voltage threshold.

27. The method of claim 17, wherein the fixed voltage is provided through a variable resistance element controlled by the voltage threshold such that the controllable voltage does not include the fixed voltage when the input signal envelope is above the voltage threshold.

28. The method of claim 21, further comprising controlling the second series pass element such that the variable DC voltage level is an amplified version of the signal envelope.

29. The method of claim 21, further comprising controlling the first series pass element such that the fixed DC voltage level is not provided to the amplifier at the higher amplitudes of the signal envelope.

30. An apparatus, comprising:
a first voltage source having a first fixed voltage level;
a second voltage source having a second fixed voltage level, the second fixed voltage level being a higher value than the first fixed voltage level;
an envelope detector configured to detect an envelope of an input signal;
a controller configured to supply an input voltage to an amplifier responsive to the envelope of the input signal, the input voltage comprising at least one of a fixed voltage from the first voltage source and a variable voltage from the second voltage source, wherein the fixed voltage and the variable voltage are substantially equal when the controller transitions the input signal from the first voltage source to the second voltage source.

31. The circuit of claim 30, wherein the input signal comprises only the fixed voltage when the envelope of the input signal is below a threshold and comprises only the variable voltage when the envelope is above a threshold.

32. The circuit of claim 30, wherein the controller comprises:
a transistor connected to the second voltage source, the transistor configured to supply the variable voltage responsive to the envelope of the input signal; and
a diode connected to the first voltage source.

33. The circuit of claim 30, wherein the controller comprises:
a first transistor connected to the first voltage source, the first transistor configured to supply the fixed voltage responsive to a reference voltage; and
a second transistor connected to the second voltage source, the second transistor configured to supply the variable voltage responsive to the envelope of the input signal.

34. An apparatus, comprising:
means for supplying a first fixed voltage level;
means for supplying a second fixed voltage level;
means for detecting an envelope of an input signal;
means for amplifying the input signal; and
means for selectively applying one or more of a fixed voltage from the first fixed voltage level supplying means and a variable voltage from the second fixed voltage level supplying means to the amplifying means responsive to the envelope of the input signal, wherein the fixed voltage and the variable voltage are substantially equal during a transition between applying the first fixed voltage level supplying means and applying the second fixed voltage level supplying means.

35. The apparatus of claim 34, wherein the applying means comprises a variable resistance means for adjusting a voltage applied to the amplifying means from the second fixed voltage level supplying means responsive to the envelope.

36. The apparatus of claim 34, wherein the applying means comprises a variable resistance means for selectively applying a voltage from the first fixed voltage level supplying means to the amplifying means responsive to a reference voltage.

* * * * *

UNITED STATES PATENT AND TRADEMARK OFFICE
CERTIFICATE OF CORRECTION

PATENT NO. : 7,317,352 B2 Page 1 of 1
APPLICATION NO. : 11/268765
DATED : January 8, 2008
INVENTOR(S) : Johan Grundlingh It is certified that error appears in the above-identified patent and that said Letters Patent is hereby corrected as shown below:

At column 8, line 45, please delete "envelopes" and insert --envelope--.

Signed and Sealed this

Twenty-ninth Day of June, 2010

David J. Kappos
*Director of the United States Patent and Trademark Office*